(12) United States Patent
Baier et al.

(10) Patent No.: US 6,342,824 B1
(45) Date of Patent: Jan. 29, 2002

(54) TRANSVERSE-MODE RESONATOR FILTER WITH THE INPUT AND OUTPUT CONVERTERS HAVING DIFFERENT IMPEDANCES

(75) Inventors: Thomas Baier, München; Ulrich Bauernschmitt, Garching, both of (DE)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 09/456,710

(22) Filed: Dec. 9, 1999

Related U.S. Application Data

(63) Continuation of application No. PCT/DE98/01505, filed on Jun. 3, 1998.

(30) Foreign Application Priority Data

Jun. 9, 1997 (DE) .......................................... 197 24 255

(51) Int. Cl.$^7$ ............................ H03H 9/145; H03H 9/64
(52) U.S. Cl. ................... 333/195; 333/196; 310/313 C; 310/313 D
(58) Field of Search ................................ 333/193–196; 310/313 R, 313 B, 313 C, 313 D

(56) References Cited

U.S. PATENT DOCUMENTS 5,581,141 A * 12/1996 Yamada et al. ......... 333/195 X
5,990,762 A * 11/1999 Nakamura et al. .......... 333/195

FOREIGN PATENT DOCUMENTS

| DE | 3130154 A1 | 2/1983 |
| DE | 4431612 A1 | 3/1995 |
| EP | 0056690 | 7/1992 |
| EP | 0772293 A1 | 5/1997 |
| JP | 6-37585 | * 2/1994 |
| JP | 7-7370 | * 1/1995 |
| JP | 8-125490 | * 5/1996 |
| JP | 8-139566 | * 5/1996 |
| JP | 8-213876 | * 8/1996 |

OTHER PUBLICATIONS

B. Wall et al.; "Balanced Driven Transversely Coupled Waveguide Resonator Filters", *1996 IEEE Ultrasonics Symposium*, vol. 1, pp. 47–51, Nov. 1996, San Antonio, TX.*

* cited by examiner

*Primary Examiner*—Robert Pascal
*Assistant Examiner*—Barbara Summons
(74) *Attorney, Agent, or Firm*—Herbert L. Lerner; Laurence A. Greenberg; Werner H. Stemer

(57) ABSTRACT

The transverse-mode resonator filter has reflectors and input and output converters arranged between the reflectors. The impedance of the input converter and/or the output converter is adjusted by reducing the original active finger overlap of the normal finger structure. The impedance can be increased by shortening the converter length of one converter, by reducing the active finger overlap of one converter by omission weighting, or by reducing the active finger overlap of one converter by overlap weighting.

8 Claims, 3 Drawing Sheets

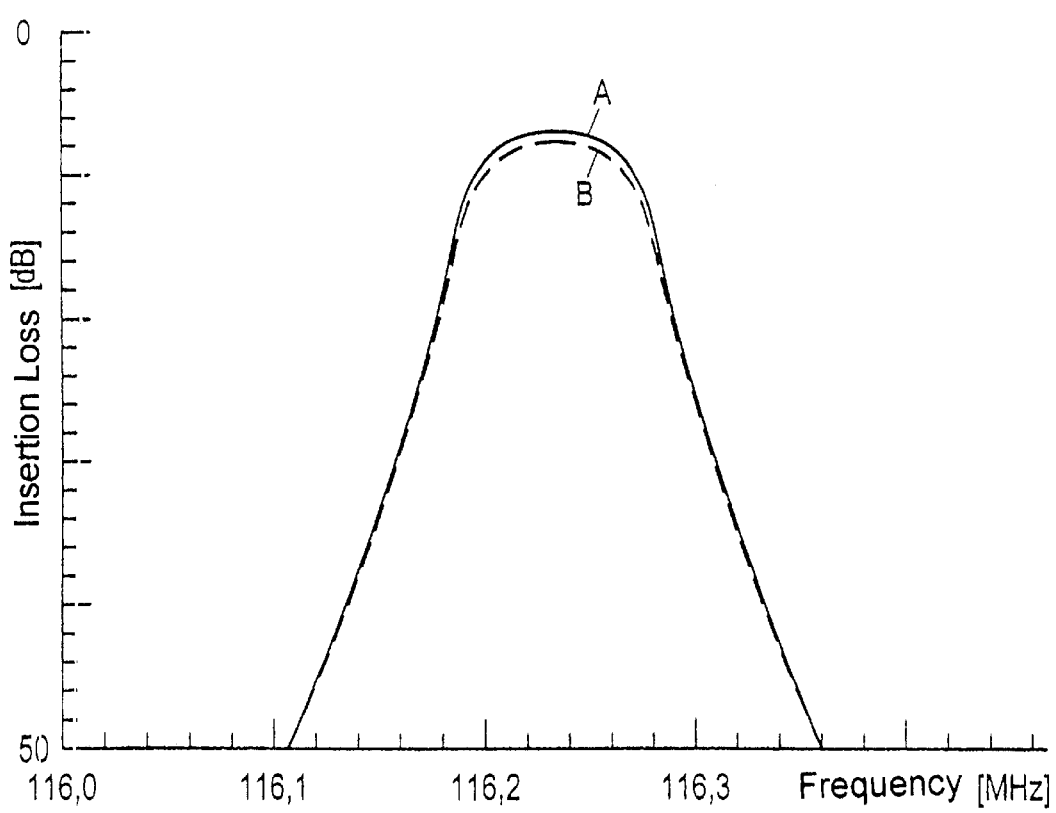

US 6,342,824 B1

TRANSVERSE-MODE RESONATOR FILTER WITH THE INPUT AND OUTPUT CONVERTERS HAVING DIFFERENT IMPEDANCES

CROSS RELATION TO RELATED APPLICATION

This is a continuation of copending International Application PCT/DE98/01505, filed Jun. 3, 1998, which designated the United States.

BACKGROUND OF THE INVENTION

FIELD OF THE INVENTION

The present invention relates to a transverse-mode-coupled surface acoustic wave resonator filter, referred to in the following as a transverse-mode resonator filter, with reflectors and input and output converters with normal finger structure arranged between the reflectors.

Resonator filters of this type are known, for example, from "1992, Ultrasonics Symposium", pages 39–43. The basic construction of the filter is illustrated schematically in FIG. 5. The resonator filter contains two resonators RES. Each of the resonators has an interdigital converter W9 and W10, respectively, with a uniform normal finger structure. Two short-circuited reflectors R1, R1 and R3, R3, respectively, are arranged in each case on opposite sides of the interdigital converters W9 and W10. The reflectors are electrically and acoustically coupled to one another via a common busbar 2, which acts as a ground rail. The busbar 2 is electrically accessible via ground terminals.

In the filter shown in FIG. 5, the interdigital converter W9 is assigned to the filter input, and the interdigital converter W10 to the filter output. All the transverse-mode resonator filters produced so far—that is to say this known filter as well—have identical input and output converters, and thus identical input and output impedances.

In order to match a surface acoustic wave filter to its circuit environment with as few problems as possible, however, the real part of the filter input impedance and of the filter output impedance must in each case be identical to the impedance of the stage which precedes the filter input and follows the filter output, respectively. This requirement is satisfied only in very rare cases, for which reason complex circuit measures are often required.

SUMMARY OF THE INVENTION

It is accordingly an object of the invention to provide a transverse mode resonator filter, which overcomes the above-mentioned disadvantages of the heretofore-known devices and methods of this general type, that is to say to provide a way by means of which it is possible to create filters with input and output impedances which differ and are matched appropriately.

With the foregoing and other objects in view there is provided, in accordance with the invention, a transverse-mode resonator filter, comprising:

an input converter with a normal finger structure;

an output converter with a normal finger structure acoustically coupled to the input converter and having a given active finger overlap with the finger structure of the input converter;

reflectors disposed adjacent the input and output converters;

one of the input and output converters having an increased impedance due to a reduced active finger overlap with respect to a normal finger structure defined by identical input and output converters.

In accordance with the invention, the reduction of the active finger overlap may be effected by any of the following three measures: The converter length of the input converter or the output converters is shortened relative to the other converter; the active finger overlap of the input converter or the output converter is reduced by omission weighting; or the active finger overlap of the input converter or the output converter is reduced by overlap weighting.

In accordance with an added feature of the invention, a free space formed by the shortened converter length is filled with additional reflectors.

In accordance with an additional feature of the invention, the omission weighting is partially provided by blind fingers.

In further summary, the object of the invention is satisfied with the transverse-mode resonator filter having input and output converters with a normal finger structure, in which the impedance of the input and/or output converters is increased by reducing the original active finger overlap of the normal finger structure and, if the finger overlap of both converters is reduced, for the amount of the reduction to be different.

It is possible to connect several of the above-outlined transverse-mode resonator filters in series and/or in parallel.

Other features which are considered as characteristic for the invention are set forth in the appended claims.

Although the invention is illustrated and described herein as embodied in a transverse-mode resonator filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a graph of the insertion loss, plotted against frequency, for the filter shown in FIG. 5 and the filter according to the invention shown in FIG. 1.

Structurally and functionally identical elements are denoted by the same reference symbols throughout the figures.

DESCRIPTION OF THE PREFERRED EMBODIMENTS

Figure 3:
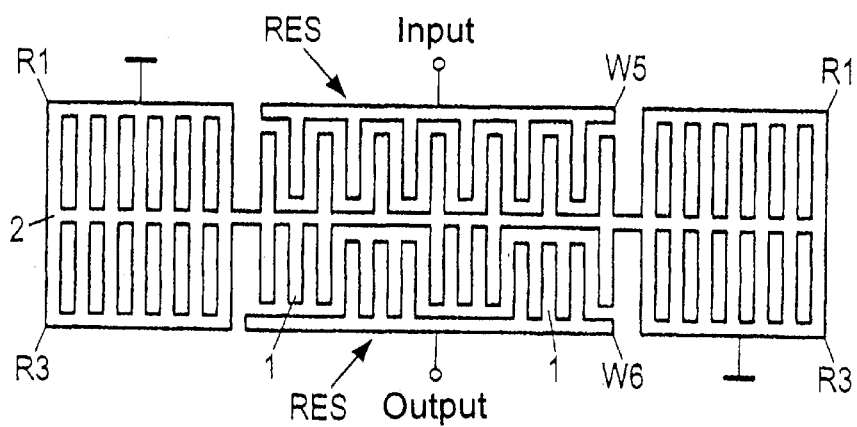
Figure 4:
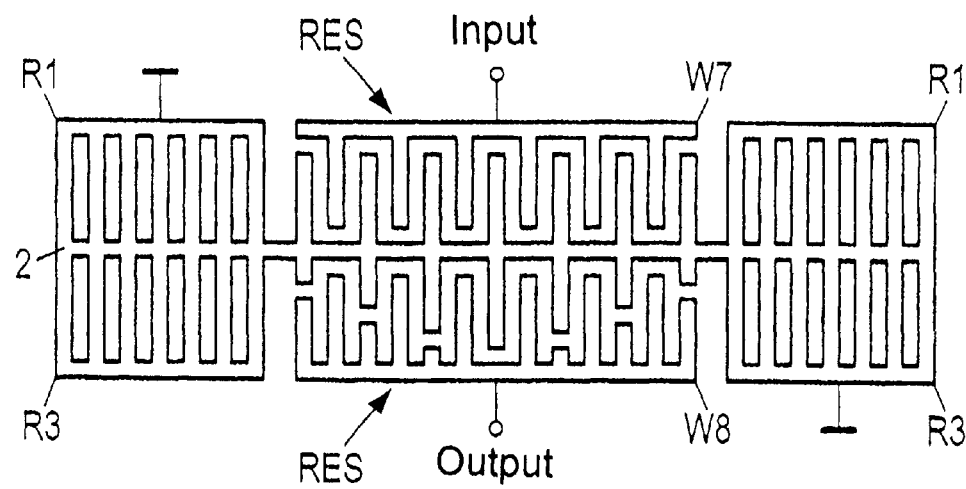
Figure 5:
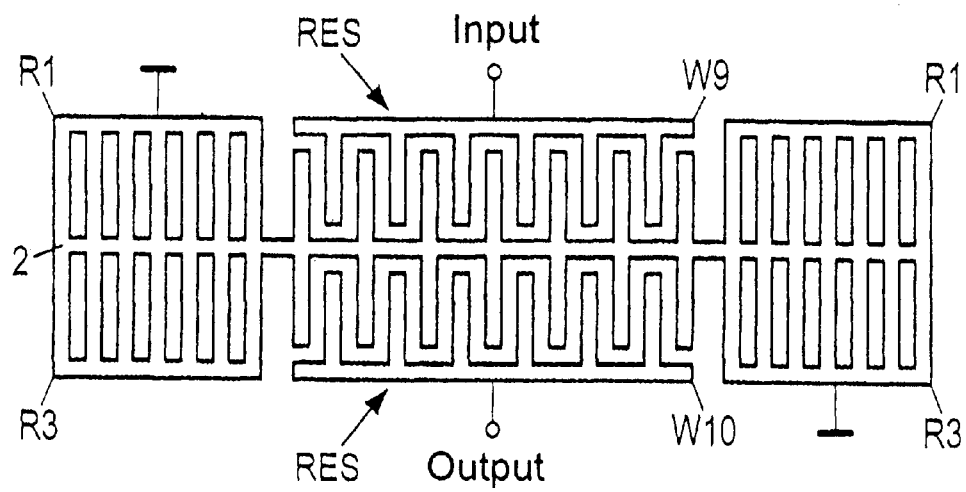
FIG. 5 is a schematic diagram of a prior art filter (described in the introduction)

With regard to FIGS. 1 to 4, reference is had to the introductory description of FIG. 5. Functionally and structurally identical components will not be described in additional detail in the following description.

Figure 1:
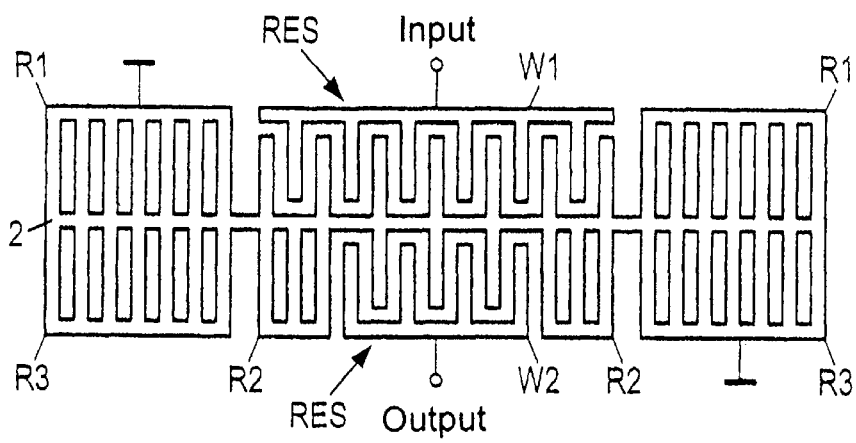
FIGS. 1, 2, 3, and 4 are schematic diagrams showing a first, a second, a third, and a fourth exemplary embodiment of a transverse-mode resonator filter according to the invention.

The filter according to FIG. 1 has an input converter W1 with a uniform finger structure, that is to say a so-called normal finger converter. The active finger overlap of the output converter W2, which is reduced in comparison to this, and the thus increased impedance of this converter can be adjusted—considered in the propagation direction of the acoustic waves—by shortening the output converter W2.

The free space created by the shortening process is—see FIG. 1—filled by additional reflectors R2, R2, thus reinforcing the reflector effect.

As has already been mentioned and moreover also relates to the following exemplary embodiments, the input converter can be structured in the same way, as required, in which case all that is necessary is to consider different active finger structures in order to avoid the same input and output impedances.

With reference to FIG. 6, there is shown the insertion loss, plotted against the frequency, for the prior art transverse-mode resonator filter as shown in FIG. 5—see the solid curve A—and for the filter shown in FIG. 1 with the output converter W2 shortened to half the length of the filter shown in FIG. 5—see the dashed curve B relating to the invention. The insertion loss difference of about 1 dB which occurs in this case is a result of circuit-dependent losses in the electrical matching network. The impedance of the output converter W2 is 4 times greater than the input impedance.

Figure 2:
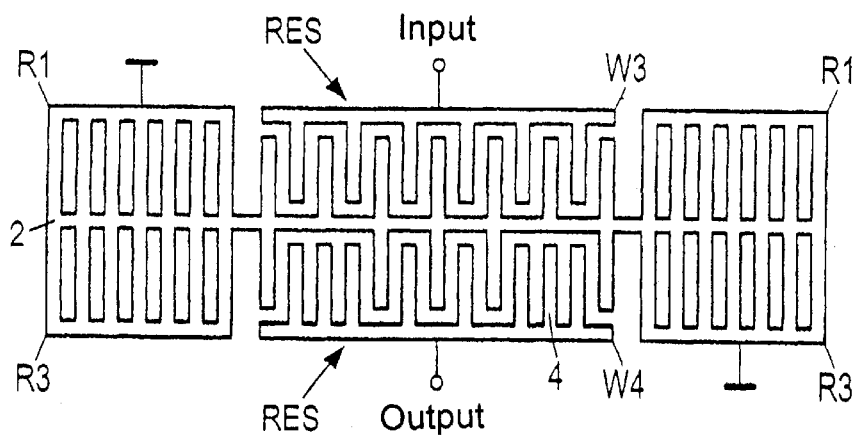

In the filter shown in FIG. 2, when the input converter W3 has a finger structure which is uniform in the same way, the impedance of the output converter W4 is achieved by omission weighting of the output converter. The omission weighting in this case provides blind fingers 4, that is to say fingers which have no overlap and are thus electrically and acoustically largely inactive.

The filter shown in FIG. 3 indicates a further option for omission weighting, the input converter of which filter with a normal finger structure being denoted by W5, while its output converter is denoted by W6. The amount of active finger overlap in the output converter W6 is in this case controlled by the arrangement of an appropriate number of blind fingers 1.

In the exemplary embodiment of a filter shown in FIG. 4, which likewise has an input converter W7 with a normal finger structure, the invention provides overlap weighting in order to increase the impedance of the output converter W8.

As has already been mentioned, the invention can also be applied to the input converters. If it is applied simultaneously to both converters, all that is necessary, if desired, is to observe a different structure change in order to avoid the same input and output impedances.

The invention is not limited to transverse-mode resonator filters with only one input converter and output converter. A plurality of filters of this type may also be connected in series or in parallel.

The filter design shown in FIGS. 2, 4 is, moreover, suitable for improving the close section of the filter as well.

We claim:

1. A transverse-mode resonator filter, comprising:

an input converter with a finger structure;

an output converter with a finger structure acoustically coupled to said input converter and having a given active finger overlap with said finger structure of said input converter;

reflectors disposed adjacent said input and output converters;

one of said input and output converters having an increased impedance with respect to the other one of said input and output converters;

said active finger overlap of one of said input and output converters is reduced by a weighting selected from the group consisting of omission weighting and overlap weighting.

2. The filter according to claim 1, wherein each of said input and output converters has a given converter length and a converter length of one of said input and output converters is shortened relative to the other converter.

3. The filter according to claim 2, wherein a free space formed by the shortened converter length is filled by additional reflectors.

4. The filter according to claim 1, wherein said input converter has the increased impedance with respect to said output converter.

5. The filter according to claim 1, wherein said input and output converters are weighted.

6. The filter according to claim 1, wherein the omission weighting is partially provided by blind fingers.

7. A transverse-mode resonator filter assembly, comprising a plurality of transverse-mode resonator filters according to claim 1 connected in series.

8. A transverse-mode resonator filter assembly, comprising a plurality of transverse-mode resonator filters according to claim 1 connected in parallel.

* * * * *